US010965047B2

(12) United States Patent
Guo et al.

(10) Patent No.: US 10,965,047 B2
(45) Date of Patent: Mar. 30, 2021

(54) CONNECTOR WITH ACTIVE CIRCUIT

(71) Applicant: Intel Corporation, Santa Clara, CA (US)

(72) Inventors: Jong-Ru Guo, Portland, OR (US); Yunhui Chu, Hillsboro, OR (US); Jun Liao, Portland, OR (US); Kai Xiao, University Place, WA (US); Jingbo Li, Portland, OR (US); Yuanhong Zhao, Pleasanton, CA (US); Mo Liu, Scotts Valley, CA (US); Beomtaek Lee, Beaverton, OR (US); James A. McCall, Portland, OR (US); Jaejin Lee, Beaverton, OR (US); Xiaoning Ye, Portland, OR (US); Zuoguo Wu, San Jose, CA (US); Xiang Li, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 20 days.

(21) Appl. No.: 16/431,498

(22) Filed: Jun. 4, 2019

(65) Prior Publication Data

US 2019/0288421 A1 Sep. 19, 2019

(51) Int. Cl.

| | |
|---|---|
| ***H05K 7/00*** | (2006.01) |
| ***H01R 12/71*** | (2011.01) |
| ***H01R 13/66*** | (2006.01) |
| *H01R 103/00* | (2006.01) |

(52) U.S. Cl.

CPC ....... *H01R 12/716* (2013.01); *H01R 13/6616* (2013.01); *H01R 2103/00* (2013.01)

(58) Field of Classification Search

CPC .............. H01R 12/716; H01R 13/6616; H01R 2103/00; H01R 13/6473; H01R 13/6658

See application file for complete search history.

(56) References Cited

U.S. PATENT DOCUMENTS

| | | | | |
|---|---|---|---|---|
| 5,085,590 A * | 2/1992 | Galloway | H01R 13/658 | 439/95 |
| 5,250,759 A * | 10/1993 | Watson | H05K 1/111 | 174/261 |
| 5,895,278 A * | 4/1999 | Humphrey | H01R 12/716 | 439/101 |
| 6,540,558 B1 * | 4/2003 | Paagman | H01R 13/6587 | 439/607.11 |
| 7,417,303 B2 * | 8/2008 | Woo | H01F 17/0006 | 257/355 |
| 2004/0266224 A1 * | 12/2004 | Watson | H01R 13/6658 | 439/66 |

(Continued)

*Primary Examiner* — Yuriy Semenenko

(74) *Attorney, Agent, or Firm* — Patent Capital Group

(57) ABSTRACT

Embodiments may relate to a connector. The connector may include a plurality of connector pins that are to communicatively couple an element of a printed circuit board (PCB) with an element of an electronic device when the element of the PCB and the element of the electronic device are coupled with the connector. The connector may also include an active circuit that is communicatively coupled with a pin of the plurality of pins. The active circuit may be configured to match an impedance of the element of the PCB with an impedance of the element of the electronic device. Other embodiments may be described or claimed.

20 Claims, 7 Drawing Sheets

(56) References Cited

U.S. PATENT DOCUMENTS

| | | | | |
|---|---|---|---|---|
| 2006/0270250 | A1* | 11/2006 | Allen ................. | H01R 13/6675 439/43 |
| 2011/0143579 | A1* | 6/2011 | Karabatsos .......... | H01R 12/721 439/485 |
| 2013/0316585 | A1* | 11/2013 | McGrath ................ | H01R 12/72 439/630 |

* cited by examiner

CONNECTOR WITH ACTIVE CIRCUIT

BACKGROUND

Connectors may be used in a broad range of high-speed signal interfaces. Examples of such interfaces may include peripheral component interconnect express (PCIe), quick-path interconnect (QPI), ultra path interconnect (UPI), serial advanced technology attachment (SATA), a memory interface (e.g., double data rate (DDR), dynamic random-access memory (DRAM), read-only memory (ROM), etc.), a back-plane connector, etc. However, the connector may introduce reflection within the signal path, which may degrade channel performance.

DETAILED DESCRIPTION

Figure 1:
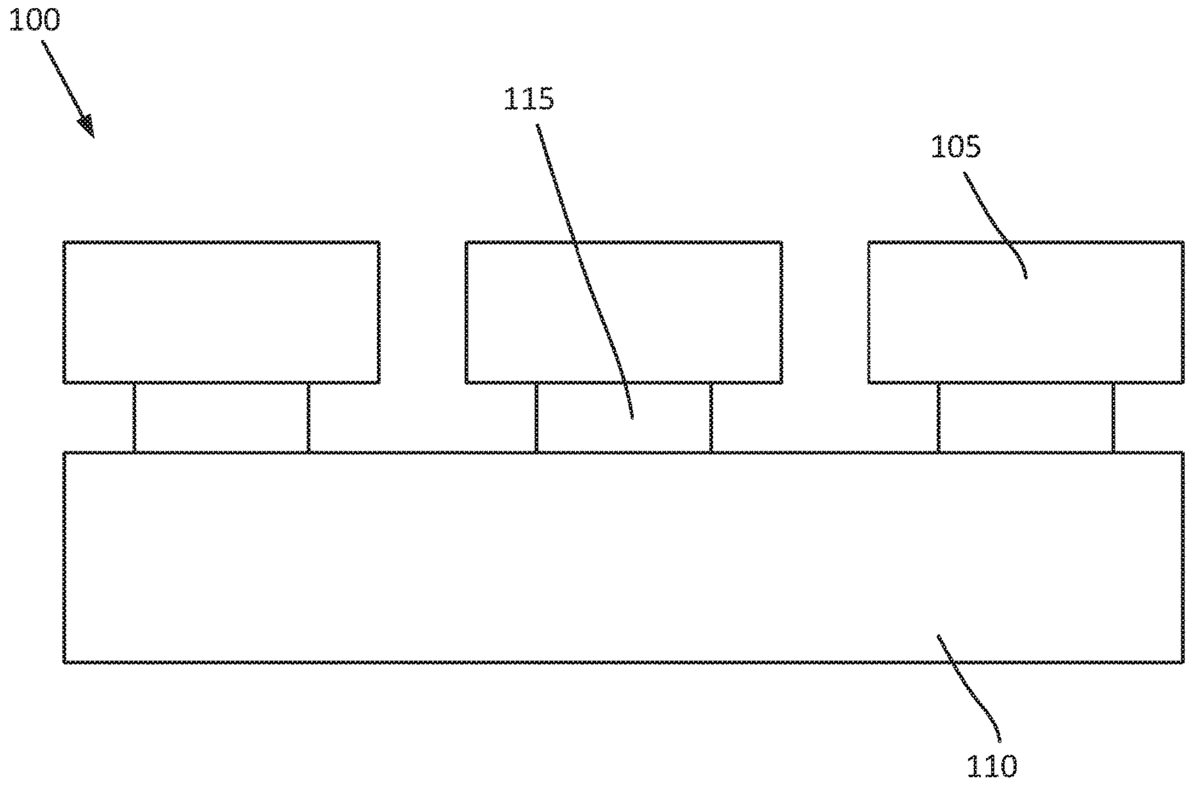
FIG. 1 depicts an example of an electronic device that may include a connector with an active circuit, in accordance with various embodiments.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

Embodiments herein may be described with respect to various Figures. Unless explicitly stated, the dimensions of the Figures are intended to be simplified illustrative examples, rather than depictions of relative dimensions. For example, various lengths/widths/heights of elements in the Figures may not be drawn to scale unless indicated otherwise. Additionally, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined, e.g., using scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Embodiments herein may relate to adding an active component or active circuit in series with a pin of the connector. The active circuit may match the impedance of the connector with the impedance seen by the signal path such that the above-described connector-based reflection is reduced, minimized, or removed.

Generally, embodiments may provide a number of benefits. For example, the return loss requirements for high-speed interconnects are becoming increasingly stringent. These requirements may impose a variety of challenges related to interconnect impedance control, particularly with respect to the connectors themselves. Embodiments herein may address the interconnect impedance control challenges by providing impedance matching and thereby increasing the signal quality in the communication pathway. Specifically, the impedance matching may allow for increased receiver eye margin. Additionally, embodiments may allow for easier channel design or provide extra performance gain. As one example, embodiments may allow for an improvement in eye height margin within the communication pathway of approximately 54% (e.g., from 14.3 millivolts (mV) to 22.1 mV) for a fifth generation PCIe channel using a specification-compliant connector as a baseline. As another example, embodiments may allow for an improvement in eye height margin within the communication pathway of approximately 30% (e.g., from 27.2 mV to 35.8 mV) for a fourth generation PCIe solid state drive (SSD) channel with two slim serial attached small computer system interface (SlimSAS) connectors and one U.2 connector as a baseline.

FIG. 1 depicts an example of an electronic device 100 that may include a connector with an active circuit, in accordance with various embodiments. Specifically, the electronic device may include a printed circuit board (PCB) 110. The PCB 110 may also, in some embodiments, be referred to as a substrate, an interposer, a motherboard, etc. Generally, the PCB 110 may be considered to be a cored or coreless substrate. The PCB 110 may include one or more layers of a dielectric material which may be organic or inorganic. The PCB 110 may further include one or more conductive elements such as vias, pads, traces, microstrips, striplines, etc. The conductive elements may be internal to, or on the surface of, the PCB 110. Generally, the conductive elements may allow for the routing of signals through the PCB 110, or between elements that are coupled to the PCB 110.

The electronic device 100 may also include a number of elements 105 that are communicatively or physically coupled with the PCB 110 by a connector 115. The elements 105 may be, for example, a die such as a processor, an element of a distributed processor such as a processor core, a memory, a radio frequency (RF) chip, or some other type of die. In other embodiments the element 105 may be an element of a communication pathway such as a cable that is designed to carry signals between the electronic device 100 and another electronic device. The communication pathway may be in accordance with a protocol such as PCIe, QPI, UPI, SATA, or some other communications protocol.

The connector 115 may be a connector as will be described in further detail below. Specifically, the connector 115 may include a number of connector pins that are situated in series with active circuit that is designed to perform impedance matching as described below. The connector 115 may include a housing with the active circuit and the connector pins positioned therein. In some embodiments, the connector 115 may include additional active or passive circuitry which may not be depicted herein.

Figure 2:
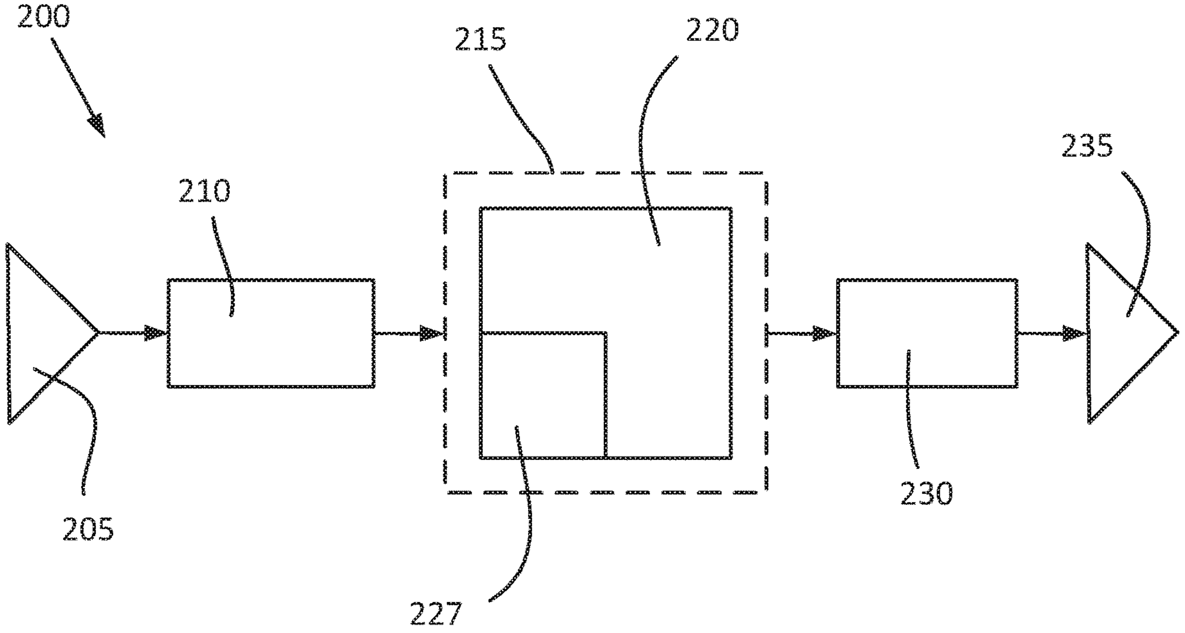
FIG. 2 depicts an example of a communication pathway, in accordance with various embodiments.

FIG. 2 depicts an example of a communication pathway 200, in accordance with various embodiments. Specifically, FIG. 2 depicts an example topology of a communication pathway that include a connector with active circuit. Specifically, the communication pathway 200 may include a signal source 205. The signal source 205 may be similar to, for example, the PCB 110 or the element 105. More specifically, the signal source 205 may be a component of the element 105 or an electrical component that is positioned within, or physically coupled with, the PCB 110. The communication pathway 200 may further include a signal path 210 that is positioned in the communication pathway 200 between the signal source 205 and the connector 215. The communication pathway may include, for example, a number of traces, vias, striplines, microstrips, interconnects such as solder bumps, pins, etc., or some other element that is able to facilitate propagation of an electronic signal between the signal source 205 and the connector 215.

The connector 215 may be similar to, and share one or more characteristics of, connector 115. Specifically, the connector 215 may include active circuit 227 and one or more connector pins 220, as will be described in further detail below. It will be understood that the graphical representation of the active circuit 227 and the connector pins 220 are generally intended as placeholder representations to depict the presence of the elements, and is not intended to depict the number, shape, or relative placement of the active circuit 227 or the connector pins 220.

The communication pathway 200 may further include a signal path 230 that is positioned between the connector 215 and a signal receiver 235. The signal path 230 may be similar to, and share one or more characteristics of, signal path 210. The signal receiver 235 may be similar to, and share one or more characteristics of, signal source 205. For example, the communication pathway 200 may allow a signal to flow from an element such as a processor (e.g., the signal source 205) to a memory (e.g., the signal receiver 235). In other embodiments, the communication pathway 200 may allow a signal to flow between other elements of an electronic device as described above.

Figure 3:
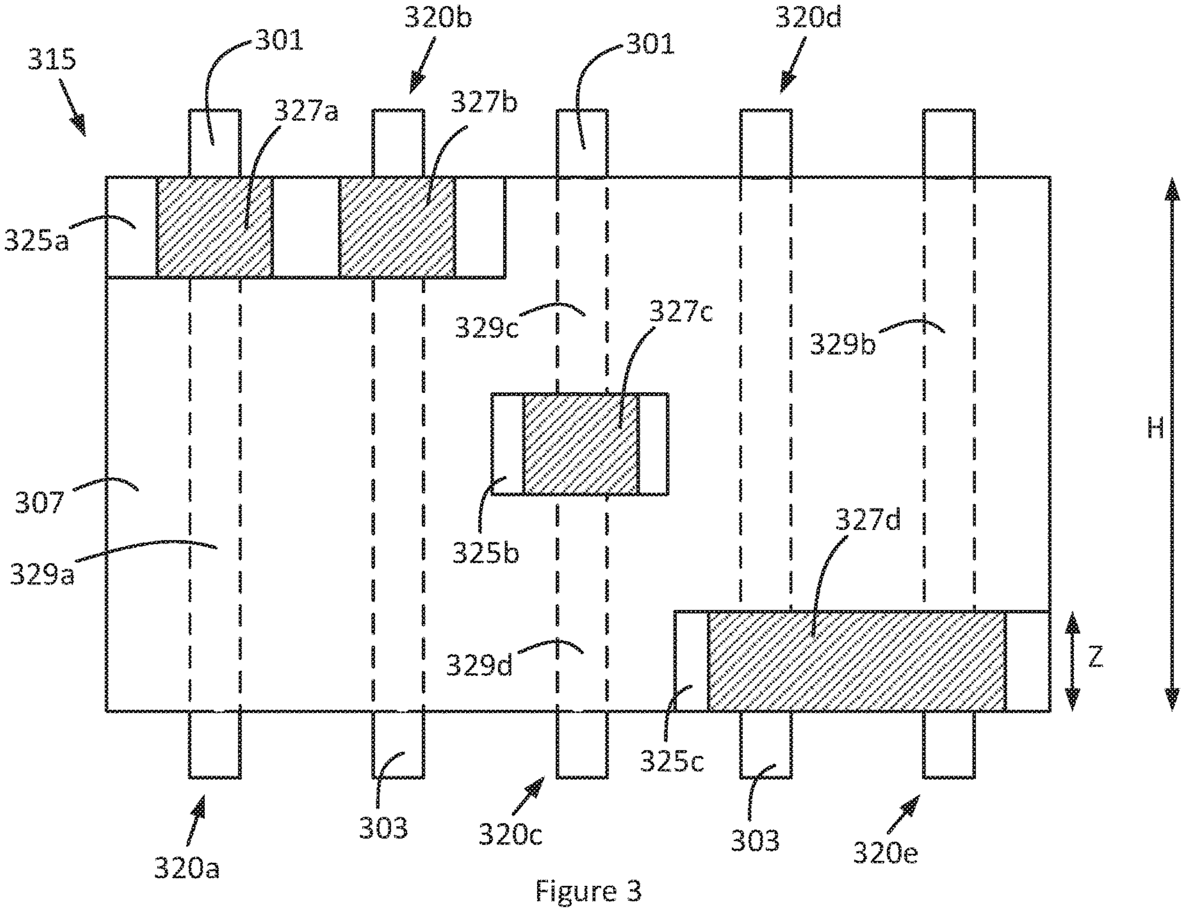
FIG. 3 depicts a simplified example of a connector with a plurality of active circuits, in accordance with various embodiments.

FIG. 3 depicts a simplified example of a connector 315 with a plurality of active circuits, in accordance with various embodiments. The connector 315 may be similar to, and share one or more characteristics of, connectors 115 or 215. The connector 315 may include a housing 307. Generally, the housing 307 may be formed of a non-conductive material such as plastic or some other material. The housing 307 may have a height H between approximately 20 millimeters (mm) and approximately 60 mm, and more specifically a height H of approximately 40 mm. However, it will be understood that in other embodiments the connector 315 may be shorter or taller than the above-described height H. The height H may be based on a variety of factors such as design characteristics of the electronic device in which the connector 315 may be used, material cost, etc.

Additionally, it will be understood that although the connector 315 is depicted or described as having a certain number of elements in a depicted configuration, in other embodiments the connector 315 may have more or fewer of the depicted elements, elements in a different configuration, or elements other than those depicted. For example, in some embodiments the connector 315 may include additional active or passive elements such as logic, circuitry, capacitors, resistors, etc. In some embodiments the connector 315 may include more or fewer connector pins, circuit structures, or active circuit, or connector pins/circuit structures/active circuit in a different arrangement than depicted. Other variations may be present in other embodiments.

The connector 315 may include a number of connectors pins 320*a*, 320*b*, 320*c*, 320*d*, and 320*e* (collectively "connector pins 320") positioned within the housing 307. The connector pins 320 may include a number of elements. Specifically, the connector pins 320 may include interconnects 301 and 303 on opposite sides of the housing 307. As depicted, the interconnects 301 and 303 may be through-hole pins (THPs). A THP may be an element that is designed to be positioned within a hole of a PCB or an element of an electronic device such as PCB 110 or element 105 of FIG. 1 and allow an electronic signal to be transmitted from the PCB/element to a conductive element within the connector 315. However, in other embodiments, one or more of interconnects 301 or 303 may be a pad, a solder bump, or some other type of conductive interconnect that does not extend into the PCB or element. Additionally, although the interconnects 301 and 303 are depicted as generally protruding from the housing 307, in some embodiments the housing 307 may at least partially surround one or more of the interconnects 301 or 303 such that the interconnects 301 or 303 are positioned within a "port" or a "female connector." In other embodiments, the interconnects 301 or 303 may be positioned at least partially within the housing 307, but still be considered to be a "male connector." Other variations may be present in other embodiments.

The connector pins 320 may additionally include a conductive element 329*a*, 329*b*, 329*c*, or 329*d* (collectively "conductive elements 329") positioned within the housing 307. In some embodiments the connector pin 320 may include only a single conductive element such as connector pins 320*a* or 320*e*, and conductive elements 329*a* or 329*b*. In some embodiments, the connector pin 320 may include a plurality of conductive elements such as connector pin 320*c* and conductive elements 329*c* and 329*d*. Generally, as depicted, the conductive elements 329 may be considered to be vias within the housing 307. However, it will be understood that the depicted connector pins 320 may be considered to be highly simplified and, in other embodiments, the connector pins 320 may include additional conductive elements such as additional vias, traces, microstrips, striplines, etc.

The connector 315 may further include circuit structures 325*a*, 325*b*, and 325*c* (collectively "circuit structures 325") that is coupled in series with the connector pins 320 as depicted in FIG. 3. In some embodiments, the circuit structures may be positioned near an edge of the housing 307 such as circuit structures 325*a* or 325*c*. In some embodiments, the circuit structures may be positioned between two conductive elements such as circuit structure 325*b* and conductive elements 329*c* and 329*d*. In some embodiments the circuit structures 325 may have a z-height Z between approximately 0.75 and approximately 4 mm, and more specifically a z-height Z of approximately 1 mm. However, in other embodiments the z-height Z may be greater or smaller than the above-described dimensions. The z-height Z may be based on factors such as the materials used, the design characteristics of the device in which the circuit structures 325 will be used, etc.

The circuit structures 325 may include active circuit 327*a*, 327*b*, 327*c*, or 327*d* (collectively "active circuit 327") as depicted in FIG. 3. In some embodiments a circuit structure may only have a single instance of active circuit such as circuit structures 325*b* and *c*, and active circuit 327*c* and 327*d*. In other embodiments a circuit structure may have a plurality of instances of active circuit such as circuit structure 325*a* and active circuit 327*a* and 327*b*.

In some embodiments the active circuit may be coupled with a single connector pin such as active circuit 327*a* and connector pin 320*a* or active circuit 327*c* and connector pin 320*c*. In some embodiments the active circuit may be coupled with a plurality of connector pins such as active circuit 327*d* which is coupled with connector pins 320*d* and 320*e*. In some embodiments, the circuit structure may be coupled with a plurality of connector pins such as circuit structure 325*a* and connector pins 320*a* and 320*b*. However, the active circuit of the circuit structure may only be coupled with a single one of the plurality of connector pins such as active circuit 327*a* and connector pin 320*a*, or active circuit 327*b* and connector pin 320*b*.

Generally, as described above and as will be described in greater detail below, the active circuit 327 may act as an impedance-matching circuit. For example, active circuit 327*c* may work to match the impedance of the connector 315, and more specifically the impedance of the connector pin 320*c* (as seen by an element coupled with interconnect 303 of connector pin 320*c*) with the impedance of the element coupled with the interconnect 303 of connector pin 320*c*. Similarly, active circuit 327*c* may work to match the impedance of the connector 315, and more specifically the impedance of the connector pin 320*c* (as seen by an element coupled with interconnect 301 of connector pin 320*c*) with the impedance of the element coupled with the interconnect 301 of connector pin 320*c*.

Figure 4:
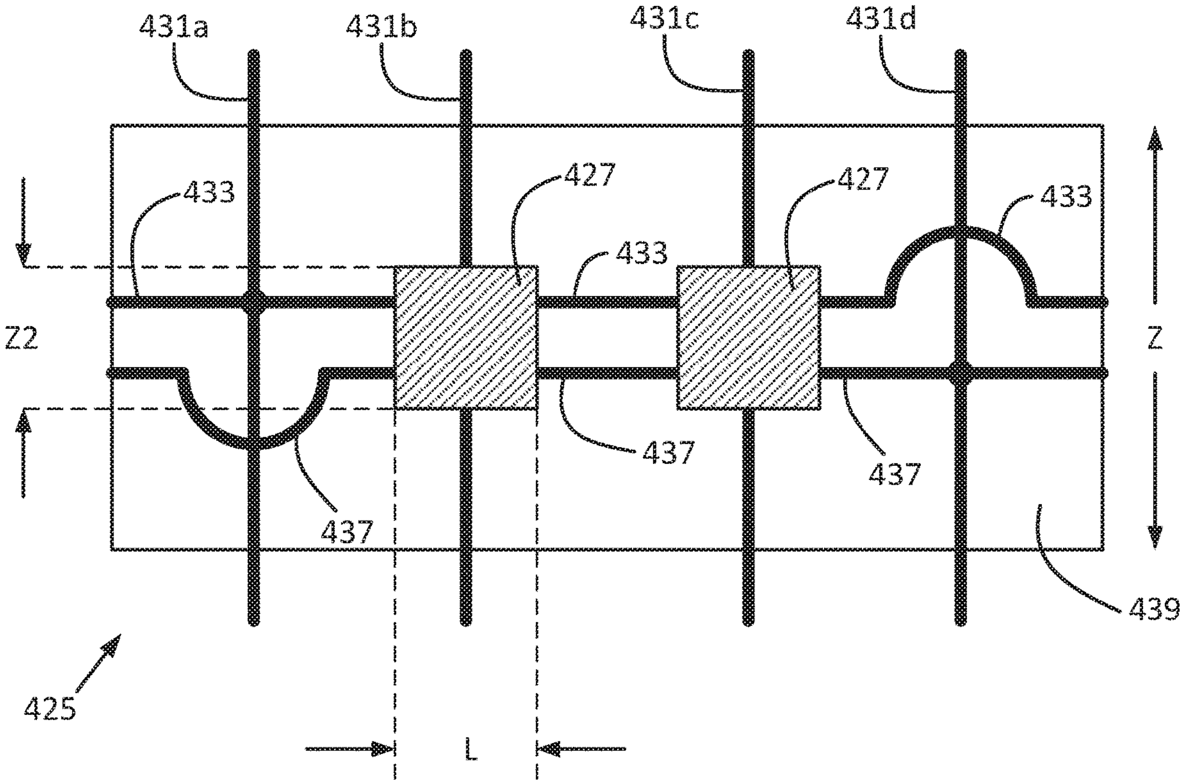
FIG. 4 depicts a simplified example view of a circuit structure, in accordance with various embodiments.

FIG. 4 depicts a simplified example view of a circuit structure 425, in accordance with various embodiments. Generally, the circuit structure 425 may be similar to, and share one or more characteristics of, circuit structures 325. Similarly to FIG. 3, it may be understood that FIG. 4 is intended as a simplified example of an embodiment, and unless indicated otherwise other embodiments may include more or fewer elements, elements with a different shape or size, elements in a different configuration, etc.

The circuit structure 425 may include a substrate 439 in which or on which various elements of the circuit structure are positioned. Generally, the substrate 439 may be cored or coreless, and may include one or more organic or inorganic dielectric materials. As one example, in some embodiments the substrate 439 may include a build-up film. Similarly to the circuit structures 325 of FIG. 3, the circuit structure 425 may have a z-height Z between approximately 0.75 and approximately 4 mm, and more specifically a z-height Z of approximately 1 mm. However, in other embodiments the z-height Z may be greater or smaller than the above-described dimensions.

The circuit structure 425 may also include one or more active circuits 427, which may be similar to and share one or more characteristics of active circuits 327. The active circuits 427 may have a z-height Z2 between approximately 0.25 mm and approximately 1 mm. In some embodiments the active circuits 427 may have a z-height Z2 of approximately 0.5 mm. Similarly, in some embodiments the active circuits 427 may have a length L (or a width dependent on which way the axes used to measure the circuit structure 425 are defined) between approximately 0.25 mm and approximately 1 mm. In some embodiments the active circuits 427 may have a length of approximately 0.5 mm. Similarly to other dimensions discussed herein, the dimensions of the active circuits 427 may be based on factors such as materials used, the specific configuration of the circuitry within the active circuit, the use case to which the circuit structure 425 will be put, thermal considerations, etc.

The circuit structure 425 may further include a number of interconnects 431*a*, 431*b*, 431*c*, and 431*d* (collectively interconnects 431). In some embodiments, the interconnects 431 may be referred to as "pins." Generally, the interconnects 431 may allow for an electrical signal to travel from one side of the circuit structure 425 to another side of the circuit structure. In some embodiments, the interconnects 431 may be communicatively coupled with elements of a connector pin such as connector pins 320. In some embodiments at least a portion of the interconnects 431 may be a portion of a connector pin such as connector pins 320. In some embodiments the interconnects 431 may be different than depicted in FIG. 4. For example, one or more of the interconnects 431 may include additional elements such as a trace, vias, microstrips, striplines, etc. In some embodiments certain of the interconnects 431 may not be strictly vertical as depicted, but rather may exit the circuit structure 425 with a different configuration (e.g., laterally or in some other direction). In some cases, the interconnects 431 may not protrude from the circuit structure 425 as depicted, but rather may end flush with a side of the substrate 439, within a cavity of the substrate 439, etc. Other variations may be present in other embodiments.

In some embodiments interconnect 431*a* may be coupled with ground, and may be communicatively coupled with a ground bus 433 that is communicatively coupled with active circuits 427. In some embodiments interconnect 431*d* may be coupled with a power source, and may be communicatively coupled with a power bus 437 that is communicatively coupled with active circuits 427. Interconnects 431*b* and 431*c* may be signal interconnects that are communicatively coupled with the active circuits 427 and configured to carry a data signal to or from the active circuit 427.

Figure 5:
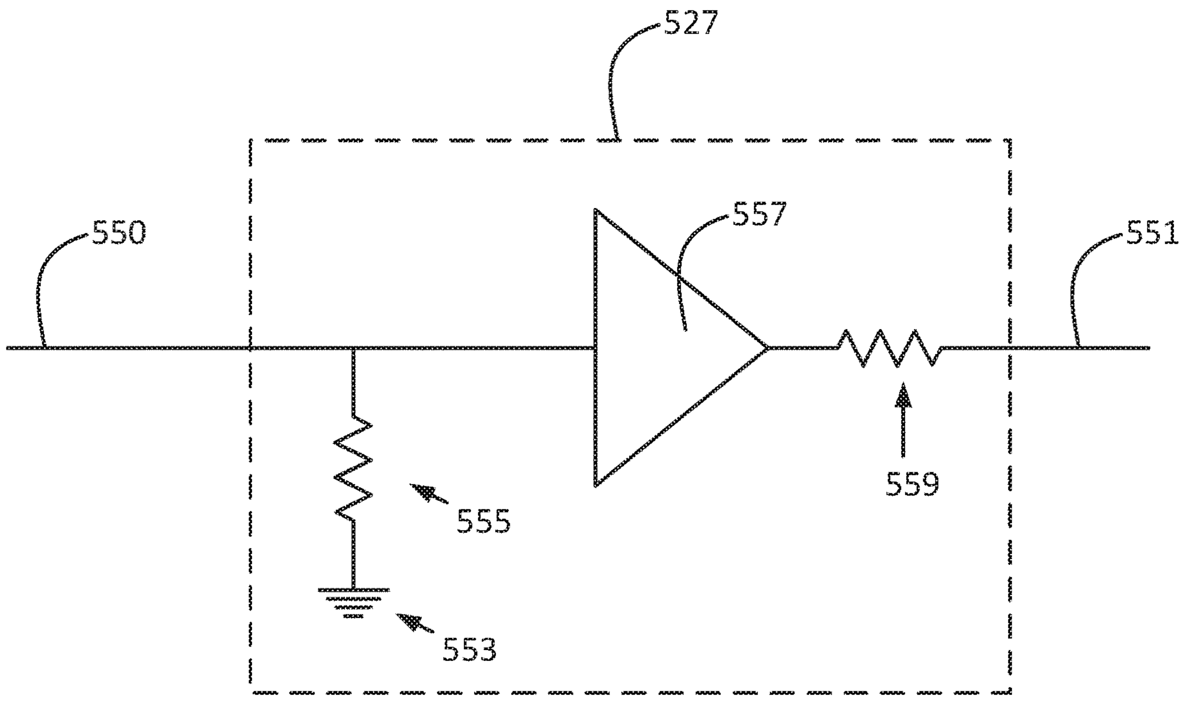
FIG. 5 depicts a simplified equivalent model of impedance-matching active circuit, in accordance with various embodiments.

FIG. 5 depicts a simplified equivalent model of impedance-matching active circuit, in accordance with various embodiments. For example, FIG. 5 depicts a high-level view of how the performance of the active circuit may be modeled. Similarly to other Figures herein, it will be understood that in other embodiments the active circuit of FIG. 5 may have more or fewer elements, elements in a different configuration, etc.

Generally, FIG. 5 depicts an active circuit 527 which may be similar to, and share one or more characteristics of, active circuits 227, 327, or 427. The active circuit 527 may receive a data signal from an input line 550. The data signal may come from, for example an interconnect such as interconnects 431*b* or 431*c*, a connector pin such as connector pins 320 (or an element thereof), or signal path 210. More generally, the data signal may originate from a signal source such as signal source 205.

The active circuit may include an input resistance 555 and an output resistance 559. A linear buffer 557 may be electrically positioned in the signal pathway between the input resistance 555 and the output resistance 559. The input resistance 555 may be coupled with ground 553, and the output resistance 559 may be coupled with an output line 551. The output line 551 may be electrically coupled with a connector pin such as connector pins 320 (or an element thereof), signal path 230, or more generally, signal receiver 235.

Generally, in operation, the input resistance 555 may be tuned such that the impedance of the active circuit 527, and more generally the connector of which the active circuit 527 is a part such as connector 215, is generally equal to the impedance of the signal path 210 prior to the connector. Similarly, the output resistance 559 may be tuned such that the impedance of the active circuit 527, and more generally the connector of which the active circuit 527 is a part such as connector 215, is generally equal to the impedance of the signal path 230 subsequent to the connector. The linear buffer 557 may operate to amplify, decrease, or otherwise alter the signal as it passes through the active circuit 527. Specifically, the linear buffer 557 may amplify the signal to increase the eye height margin as the signal passes through the active circuit 527. In some cases, the signal may be degraded by the presence of the input resistance 555, and so the linear buffer 557 may serve to remedy this signal degradation. In this way, the active circuit 527 may accomplish two goals. First, the active circuit 527 may increase the eye height margin, and therefore the signal quality, as the signal propagates through the active circuit 527 and, more generally, the connector 215. Additionally, the active circuit 527 may reduce or eliminate the above-described reflection which may lead to signal degradation.

Figure 6:
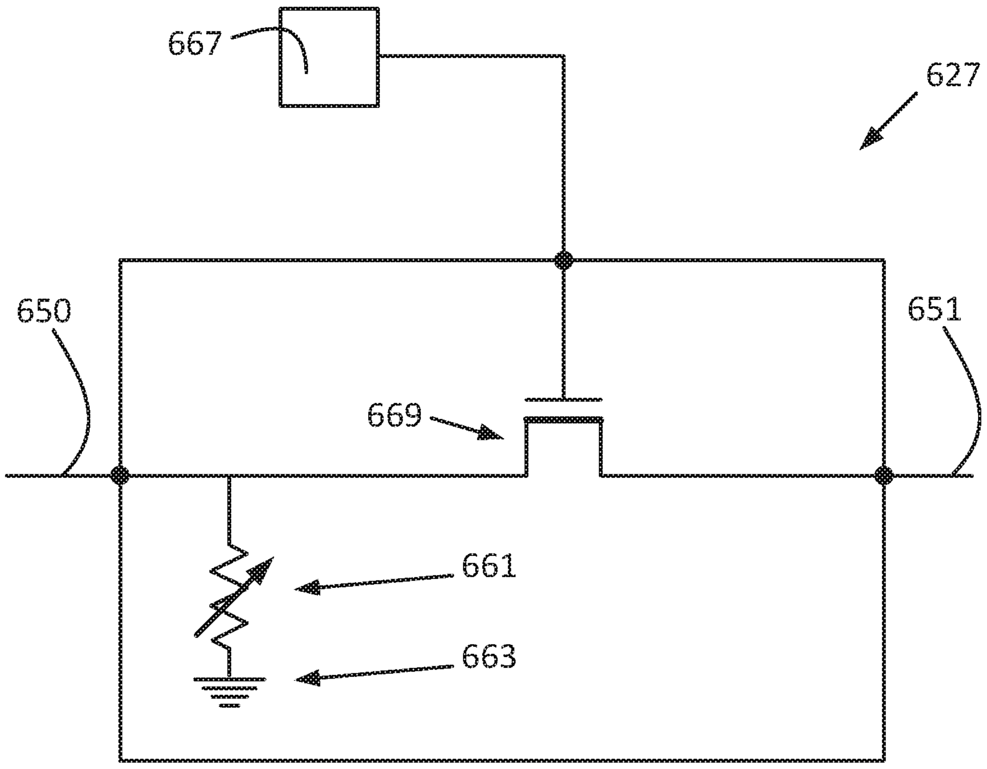
FIG. 6 depicts a more detailed model of impedance-matching active circuit, in accordance with various embodiments.

FIG. 6 depicts a more detailed model of impedance-matching active circuit, in accordance with various embodiments. Similarly to other Figures herein, it will be understood that FIG. 6 is intended as one example of an active circuit, and other embodiments may include more or fewer elements, elements in a different configuration, etc. For example, in some embodiments the example active circuit of FIG. 6 may include additional active or passive components, additional connections to ground, etc.

FIG. 6 depicts an active circuit 627 which may be similar to, and share one or more characteristics of, an active circuit described herein such as active circuits 227, 327, 427, or 527. The active circuit 627 may include an input line 650 and an output line 651 which may be similar to, and share one or more characteristics of, input line 550 and output line 551.

The active circuit 627 may include a transistor 669. The gate of the transistor 669 may be communicatively coupled with a voltage source 667. The voltage source 667 may be, for example, a voltage source 667 such as a direct current (DC) power supply, an alternating current (AC) power supply, a battery, or some other type of voltage source. In some embodiments the voltage source 667 may be an element of the active circuit 627 while in other embodiments the voltage source 667 may be separate from, but communicatively coupled with, the active circuit 627.

The transistor 669 may be, for example, a field effect transistor (FET) as depicted, however in other embodiments the transistor 669 may be another type of transistor such as a junction-FET (JFET), a bipolar junction transistor (BJT), a metal-oxide semiconductor FET (MOSFET), or some other type of transistor. In some embodiments, the transistor 669 may be a single transistor as shown in FIG. 6, whereas in other embodiments the transistor 669 may be replaced by two or more transistors either in series or in parallel. The active circuit 627 may further include a tunable resistor 661 as shown. The tunable resistor 661 may be coupled with ground 663.

In operation, the parameters of the active circuit 627 may be selected such that the impedance of the active circuit 627 as measured at input line 650 is generally equal to the impedance of the communication pathway of which the circuit is a part between the signal source and the active circuit 627. The parameters of the active circuit 627 may further be selected such that the impedance of the active circuit 627 as measured at the output line 651 is generally equal to the impedance of the communication pathway of which the circuit is a part between the signal receiver and the active circuit 627. In this way, the active circuit 627 may help achieve the above-listed benefits of various embodiments.

One such parameter of the active circuit 627 that may be selected may be related to the transistor 669. Specifically, the material of the transistor, the type of transistor, the number and configuration of the transistors if there are multiple transistors, etc. may be selected to achieve the impedance matching. More specifically, the transistor 669 may act as a linear buffer such as linear buffer 557 discussed above. The various values of the transistor 669 may further affect both the input and output resistance of the active circuit 627. In some embodiments, the values of the transistor 669 may be selected based on a desired output swing of the output resistance of the active circuit 627.

Additionally, the impedance value of the tunable resistor 661 may be selected to achieve a desired input resistance of the active circuit 627. The impedance value of the tunable resistor 661 may further affect, or be based on, a desired output resistance or a desired output swing of the active circuit 627. Similarly, the voltage source 667 may provide a bias voltage to the active circuit 627 and, more specifically, to the gate of the transistor 669. Similarly to other values herein, the bias voltage provided by the voltage source may be based on factors such as a desired input resistance, output resistance, output swing, etc.

Figure 7:
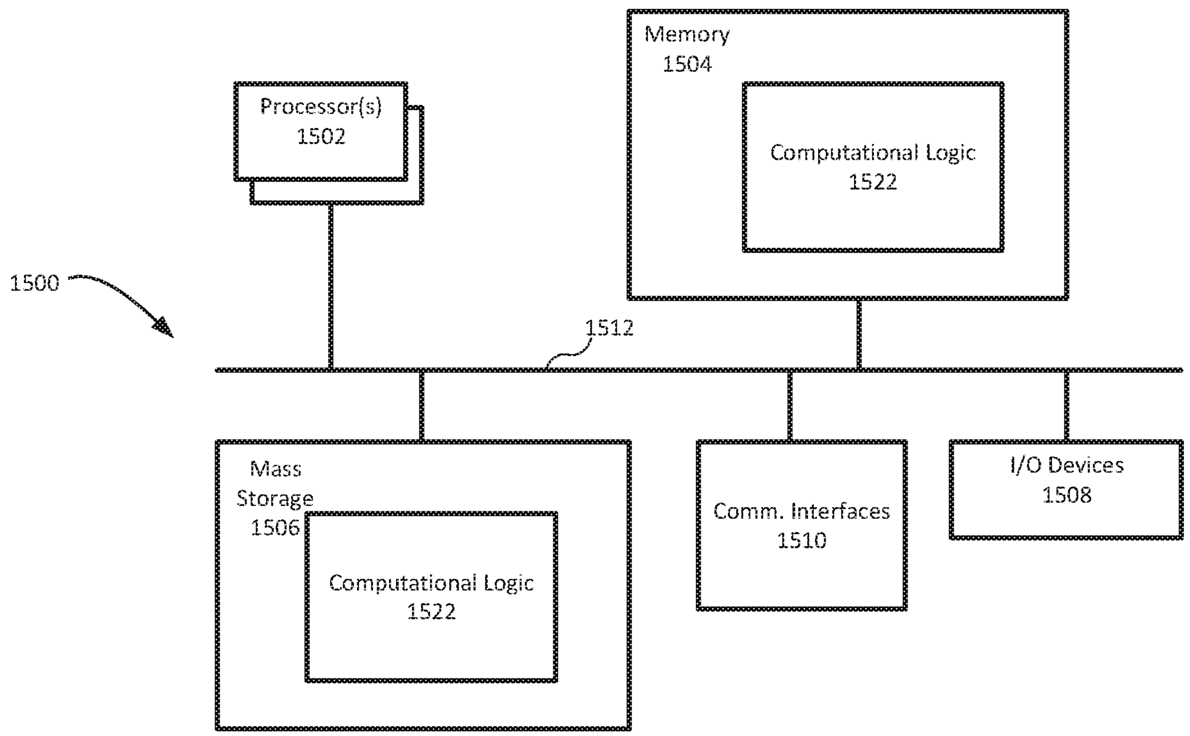
FIG. 7 illustrates an example device that may use a connector with an active circuit, in accordance with various embodiments.

FIG. 7 illustrates an example computing device 1500 which may include one or more connectors such as connectors 115, 215, 315, etc. Specifically, the example computing device 1500 may include a connector with an active circuit as described herein.

As shown, computing device 1500 may include one or more processors or processor cores 1502 and system memory 1504. For the purpose of this application, including the claims, the terms "processor" and "processor cores" may be considered synonymous, unless the context clearly requires otherwise. The processor 1502 may include any type of processors, such as a CPU, a microprocessor, and the like. The processor 1502 may be implemented as an integrated circuit having multi-cores, e.g., a multi-core microprocessor. The computing device 1500 may include mass storage devices 1506 (such as diskette, hard drive, volatile memory (e.g., DRAM, compact disc read-only memory (CD-ROM), digital versatile disk (DVD), and so forth)). In general, system memory 1504 and/or mass storage devices 1506 may be temporal and/or persistent storage of any type, including, but not limited to, volatile and non-volatile memory, optical, magnetic, and/or solid state mass storage, and so forth. Volatile memory may include, but is not limited to, static and/or DRAM. Non-volatile memory may include, but is not limited to, electrically erasable programmable ROM, phase change memory, resistive memory, and so forth. In some embodiments, one or both of the system memory 1504 or the mass storage device 1506 may include computational logic 1522, which may be configured to implement or perform, in whole or in part, one or more instructions that may be stored in the system memory 1504 or the mass storage device 1506. In other embodiments, the computational logic 1522 may be configured to perform a memory-related command such as a read or write command on the system memory 1504 or the mass storage device 1506.

The computing device 1500 may further include input/output (I/O) devices 1508 (such as a display (e.g., a touchscreen display), keyboard, cursor control, remote control, gaming controller, image capture device, and so forth) and communication interfaces 1510 (such as network interface cards, modems, infrared receivers, radio receivers (e.g., Bluetooth), and so forth).

The communication interfaces 1510 may include communication chips (not shown) that may be configured to operate the device 1500 in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or Long-Term Evolution (LTE) network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication interfaces 1510 may operate in accordance with other wireless protocols in other embodiments.

The computing device 1500 may further include or be coupled with a power supply. The power supply may, for example, be a power supply that is internal to the computing device 1500 such as a battery. In other embodiments the power supply may be external to the computing device 1500. For example, the power supply may be an electrical source such as an electrical outlet, an external battery, or some other type of power supply. The power supply may be, for example AC, direct current (DC) or some other type of power supply. The power supply may in some embodiments include one or more additional components such as an AC to DC convertor, one or more downconverters, one or more upconverters, transistors, resistors, capacitors, etc. that may be used, for example, to tune or alter the current or voltage of the power supply from one level to another level. In some embodiments the power supply may be configured to provide power to the computing device 1500 or one or more discrete components of the computing device 1500 such as the processor(s) 1502, mass storage 1506, I/O devices 1508, etc.

The above-described computing device 1500 elements may be coupled to each other via system bus 1512, which may represent one or more buses. In the case of multiple buses, they may be bridged by one or more bus bridges (not shown). Each of these elements may perform its conventional functions known in the art. The various elements may be implemented by assembler instructions supported by processor(s) 1502 or high-level languages that may be compiled into such instructions.

The permanent copy of the programming instructions may be placed into mass storage devices 1506 in the factory, or in the field, through, for example, a distribution medium (not shown), such as a compact disc (CD), or through communication interface 1510 (from a distribution server (not shown)). That is, one or more distribution media having an implementation of the agent program may be employed to distribute the agent and to program various computing devices.

The number, capability, and/or capacity of the elements 1508, 1510, 1512 may vary, depending on whether computing device 1500 is used as a stationary computing device, such as a set-top box or desktop computer, or a mobile computing device, such as a tablet computing device, laptop computer, game console, or smartphone. Their constitutions are otherwise known, and accordingly will not be further described.

In various implementations, the computing device 1500 may comprise one or more components of a data center, a laptop, a netbook, a notebook, an ultrabook, a smartphone, a tablet, a personal digital assistant (PDA), an ultra mobile PC, a mobile phone, or a digital camera. In further implementations, the computing device 1500 may be any other electronic device that processes data.

In some embodiments, as noted above, computing device 1500 may include one or more connectors such as connectors 115, 215, 315, etc. with an active circuit. Specifically, various elements of the computing device 1500 such as the processor 1502, the memory 1504, etc. may be implemented as an element such as element 105 that is coupled with a PCB such as PCB 110 by a connector such as connectors 115, 215, 315, etc. that include an active circuit. In other embodiments, a connector such as connectors 115, 215, 315, etc. may by used to couple an I/O device 1508 to the computing device 1500. Connectors with active circuits may be used to communicatively coupled other elements of the computing device 1500 in other embodiments.

EXAMPLES OF VARIOUS EMBODIMENTS

Example 1 includes a connector comprising: a housing; a plurality of connector pins positioned within the housing, wherein the connector pins are to communicatively couple an element of a printed circuit board (PCB) with an element of an electronic device when the element of the PCB and the element of the electronic device are coupled with the connector; and an active circuit positioned within the housing, wherein the active circuit is communicatively coupled with a pin of the plurality of pins, and wherein the active circuit is to match an impedance of the element of the PCB with an impedance of the element of the electronic device.

Example 2 includes the connector of example 1, wherein the active circuit is serially coupled with the connector pin.

Example 3 includes the connector of example 1, wherein the pin is a first pin and the active circuit is a first active circuit, and wherein the connector further comprises a second active circuit positioned within the housing, wherein the second active circuit is communicatively coupled with a second pin of the plurality of pins, and wherein the second active circuit is to match an impedance of the element of the PCB with an impedance of the element of the electronic device.

Example 4 includes the connector of example 1, wherein the active circuit has a z-height of less than 1 millimeter (mm) as measured in a direction perpendicular to a face of the PCB to which the connector is to couple.

Example 5 includes the connector of example 4, wherein the active circuit has a z-height of less than 0.5 mm.

Example 6 includes the connector of any of examples 1-5, wherein the active circuit has a length of less than 1 millimeter (mm) as measured in a direction parallel to a face of the PCB to which the connector is to couple.

Example 7 includes the connector of example 6, wherein the active circuit has a length of less than 0.5 mm.

Example 8 includes the connector of any of examples 1-5, wherein the active circuit includes a linear buffer.

Example 9 includes an electronic device comprising: a printed circuit board (PCB) that includes a signal source; an electronic component; and a connector that communicatively couples the electronic component to the signal source, wherein the connector includes: a plurality of pins; and an active circuit communicatively coupled with the pin, wherein the active circuit includes a linear buffer that is to match an input impedance of the active circuit with an impedance of the signal source, and wherein the linear buffer is further to match an output impedance of the active circuit with an impedance of the electronic component.

Example 10 includes the electronic device of example 9, wherein the linear buffer includes a transistor.

Example 11 includes the electronic device of examples 9 or 10, wherein the active circuit includes a bias voltage that is communicatively coupled with an input of the active circuit, an output of the active circuit, and the linear buffer.

Example 12 includes the electronic device of example 11, wherein a value of the bias voltage is based on the impedance of the signal source or the impedance of the electronic component.

Example 13 includes the electronic device of example 11, wherein a value of the bias voltage is based on a desired output swing of the output impedance of the active circuit.

Example 14 includes the electronic device of examples 9 or 10, wherein the active circuit further includes a tunable resistor that is communicatively coupled with the linear buffer and an input of the active circuit.

Example 15 includes the electronic device of example 14, wherein a value of the tunable resistor is based on the impedance of the signal source or the impedance of the electronic component.

Example 16 includes the electronic device of example 14, wherein a value of the tunable resistor is based on a desired output swing of the output impedance of the active circuit.

Example 17 includes a backplane connector comprising: a plurality of pins that include a first pin and a second pin, wherein the plurality of pins are to communicatively couple a first signal source and a second signal source that are coupled with the backplane connector to an electronic component that is coupled with the backplane connector, and wherein the backplane connector is to facilitate communication between the first signal source and the electronic component or the second signal source and the electronic component in accordance with a high-speed signal interface; a first active circuit that is communicatively coupled with the first pin and communicatively positioned between the first signal source and the electronic component when the backplane connector is coupled with the first signal source, wherein the first active circuit includes a linear buffer that is to match an input impedance of the first active circuit with an impedance of the first signal source, and wherein the linear buffer is further to match an output impedance of the first active circuit with an impedance of the electronic component; and a second active circuit that is communicatively coupled with the second pin and communicatively positioned between the second signal source and the electronic component when the backplane connector is coupled with the second signal source, wherein the second active circuit includes a linear buffer that is to match an input impedance of the second active circuit with an impedance of the second signal source, and wherein the linear buffer is further to match an output impedance of the second active circuit with an impedance of the electronic component.

Example 18 includes the backplane connector of example 17, wherein the linear buffer of the first active circuit includes a plurality of transistors.

Example 19 includes the backplane connector of examples 17 or 18, wherein the first active circuit includes a bias voltage and a tunable resistor.

Example 20 includes the backplane connector of example 19, wherein a value of the bias voltage or a value of the tunable resistor is based on the impedance of the first signal source or the impedance of the first pin.

Example 21 may include the connector of any of examples 1-5, wherein the connector is to facilitate communication between the element of the PCB and the element of the electronic device in accordance with a peripheral component interconnect express (PCIe) protocol.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or limiting as to the precise forms disclosed. While specific implementations of, and examples for, various embodiments or concepts are described herein for illustrative purposes, various equivalent modifications may be possible, as those skilled in the relevant art will recognize. These modifications may be made in light of the above detailed description, the Abstract, the Figures, or the claims.

The invention claimed is:

1. A connector comprising:

a housing;

a plurality of connector pins positioned within the housing, wherein the connector pins are to communicatively couple an element of a printed circuit board (PCB) with an element of an electronic device when the element of the PCB and the element of the electronic device are coupled with the connector; and an active circuit positioned within the housing, wherein the active circuit is communicatively coupled with a pin of the plurality of pins, the active circuit is to match an impedance of the element of the PCB with an impedance of the element of the electronic device, the active circuit has a z-height of less than 1 millimeter (mm) as measured in a direction perpendicular to a face of the PCB to which the connector is to couple, the active circuit includes a linear buffer, and the active circuit further includes a tunable resistor that is communicatively coupled with the linear buffer and an input of the active circuit.

2. The connector of claim 1, wherein the active circuit is serially coupled with the connector pin.

3. The connector of claim 1, wherein the pin is a first pin and the active circuit is a first active circuit, and wherein the connector further comprises a second active circuit positioned within the housing, wherein the second active circuit is communicatively coupled with a second pin of the plurality of pins, and wherein the second active circuit is to match an impedance of the element of the PCB with an impedance of the element of the electronic device.

4. The connector of claim 1, wherein the connector is to facilitate communication between the element of the PCB and the element of the electronic device in accordance with a peripheral component interconnect express (PCIe) protocol.

5. The connector of claim 1, wherein the active circuit has a z-height of less than 0.5 mm.

6. The connector of claim 1, wherein the active circuit has a length of less than 1 millimeter (mm) as measured in a direction parallel to a face of the PCB to which the connector is to couple.

7. The connector of claim 6, wherein the active circuit has a length of less than 0.5 mm.

8. The connector of claim 1, wherein the linear buffer is to match an input impedance of the active circuit with an impedance of the element of the PCB, and the linear buffer is further to match an output impedance of the active circuit with an impedance of the electronic device.

9. The connector of claim 3, wherein the second active circuit includes a linear buffer, the linear buffer of the second active circuit is to match an input impedance of the second active circuit with an impedance of the element of the PCB, and the linear buffer of the second active circuit is further to match an output impedance of the second active circuit with an impedance of the electronic device.

10. An electronic device comprising:

a printed circuit board (PCB) that includes a signal source;

an electronic component; and a connector that communicatively couples the electronic component to the signal source, wherein the connector includes:

a plurality of pins; and an active circuit communicatively coupled with the pin, wherein the active circuit includes a linear buffer that is to match an input impedance of the active circuit with an impedance of the signal source, the linear buffer is further to match an output impedance of the active circuit with an impedance of the electronic component, and the active circuit is to provide a bias voltage that is communicatively coupled with an input of the active circuit, an output of the active circuit, and the linear buffer.

11. The electronic device of claim 10, wherein the linear buffer includes a transistor.

12. The electronic device of claim 10, wherein a value of the bias voltage is based on the impedance of the signal source or the impedance of the electronic component.

13. The electronic device of claim 10, wherein a value of the bias voltage is based on a desired output swing of the output impedance of the active circuit.

14. The electronic device of claim 10, wherein the active circuit further includes a tunable resistor that is communicatively coupled with the linear buffer and an input of the active circuit.

15. The electronic device of claim 14, wherein a value of the tunable resistor is based on the impedance of the signal source or the impedance of the electronic component.

16. The electronic device of claim 14, wherein a value of the tunable resistor is based on a desired output swing of the output impedance of the active circuit.

17. A backplane connector comprising:

a plurality of pins that include a first pin and a second pin, wherein the plurality of pins are to communicatively couple a first signal source and a second signal source that are coupled with the backplane connector to an electronic component that is coupled with the backplane connector, and wherein the backplane connector is to facilitate communication between the first signal source and the electronic component or the second signal source and the electronic component in accordance with a high-speed signal interface;

a first active circuit that is communicatively coupled with the first pin and communicatively positioned between the first signal source and the electronic component when the backplane connector is coupled with the first signal source, wherein the first active circuit includes a linear buffer that is to match an input impedance of the first active circuit with an impedance of the first signal source, and wherein the linear buffer is further to match an output impedance of the first active circuit with an impedance of the electronic component; and a second active circuit that is communicatively coupled with the second pin and communicatively positioned between the second signal source and the electronic component when the backplane connector is coupled with the second signal source, wherein the second active circuit includes a linear buffer that is to match an input impedance of the second active circuit with an impedance of the second signal source, and wherein the linear buffer is further to match an output impedance of the second active circuit with an impedance of the electronic component.

18. The backplane connector of claim 17, wherein the linear buffer of the first active circuit includes a plurality of transistors.

19. The backplane connector of claim 17, wherein the first active circuit includes a bias voltage and a tunable resistor.

20. The backplane connector of claim 19, wherein a value of the bias voltage or a value of the tunable resistor is based on the impedance of the first signal source or the impedance of the first pin.

* * * * *